US009157148B2

(12) United States Patent
Tamura

(10) Patent No.: US 9,157,148 B2
(45) Date of Patent: *Oct. 13, 2015

(54) SHADOW MASK ALIGNMENT USING CODED APERTURES

(75) Inventor: Nobuhiko Tamura, Murrysville, PA (US)

(73) Assignee: ADVANTECH GLOBAL, LTD, Tortola (VG)

( * ) Notice: Subject to any disclaimer, the term of this patent is extended or adjusted under 35 U.S.C. 154(b) by 153 days.

This patent is subject to a terminal disclaimer.

(21) Appl. No.: 13/695,488

(22) PCT Filed: May 23, 2011

(86) PCT No.: PCT/US2011/037501
§ 371 (c)(1),
(2), (4) Date: Jan. 14, 2013

(87) PCT Pub. No.: WO2011/153016
PCT Pub. Date: Dec. 8, 2011

(65) Prior Publication Data
US 2013/0236287 A1 Sep. 12, 2013

Related U.S. Application Data

(60) Provisional application No. 61/351,470, filed on Jun. 4, 2010.

(51) Int. Cl.
G01B 11/00 (2006.01)
C23C 16/04 (2006.01)
C23C 14/04 (2006.01)
C23C 14/54 (2006.01)

(52) U.S. Cl.
CPC ............. *C23C 16/042* (2013.01); *C23C 14/042* (2013.01); *C23C 14/54* (2013.01)

(58) Field of Classification Search
CPC ....... G03F 9/7049; G03F 9/7088; G03F 9/00; G01B 11/272; H01L 21/681
USPC .................................................. 356/399–401
See application file for complete search history.

(56) References Cited

U.S. PATENT DOCUMENTS 3,504,606 A 4/1970 Macovski
3,647,948 A 3/1972 Eto et al.
(Continued)

FOREIGN PATENT DOCUMENTS

CN 101158818 A 4/2008
JP 2001-514804 A 9/2001
(Continued)

*Primary Examiner* — Tarifur Chowdhury
*Assistant Examiner* — Isiaka Akanbi
(74) *Attorney, Agent, or Firm* — The Webb Law Firm

(57) ABSTRACT

In a shadow mask-substrate alignment method, a substrate is provided that includes a grate having a plurality of spaced bars and a shadow mask is provided that includes a grate having a plurality of spaced bars. Also provided is a light source-light receiver pair that defines a path of light therebetween. The grate of the substrate and the grate of the shadow mask are caused to be positioned in the path of the light. Thereafter, the orientation of the substrate, the shadow mask, or both are caused to be adjusted to position the grate of the substrate, the grate of the shadow mask, or both until a predetermined amount of light or a predetermined range of an amount of light on the path passing through the grates is received by the light receiver.

22 Claims, 5 Drawing Sheets

(56) References Cited

U.S. PATENT DOCUMENTS

| | | | |
|---|---|---|---|
| 3,885,877 A * | 5/1975 | Horwath et al. | 356/400 |
| 4,109,158 A * | 8/1978 | Blitchington et al. | 250/548 |
| 4,211,489 A | 7/1980 | Kleinknecht et al. | |
| 4,590,527 A | 5/1986 | Warner | |
| 4,828,392 A * | 5/1989 | Nomura et al. | 356/401 |
| 4,926,545 A | 5/1990 | Pimpinella et al. | |
| 5,119,355 A | 6/1992 | Yamamoto et al. | |
| 5,361,132 A * | 11/1994 | Farn | 356/509 |
| 5,414,514 A * | 5/1995 | Smith et al. | 356/509 |
| 5,528,027 A | 6/1996 | Mizutani | |
| 5,563,682 A * | 10/1996 | Aikawa et al. | 355/53 |
| 6,661,951 B1 | 12/2003 | Blair et al. | |
| 7,902,494 B2 * | 3/2011 | Klaver et al. | 250/237 G |
| 2002/0080365 A1 | 6/2002 | Monshouwer et al. | |
| 2006/0007442 A1 | 1/2006 | Heerens et al. | |
| 2006/0086321 A1 | 4/2006 | Brody et al. | |
| 2007/0019173 A1 * | 1/2007 | Marz | 355/53 |
| 2010/0065726 A1 * | 3/2010 | Zhong et al. | 250/227.24 |
| 2010/0316941 A1 * | 12/2010 | Sasaki | 430/5 |

FOREIGN PATENT DOCUMENTS

| | | |
|---|---|---|
| KR | 10-0296634 | 8/2001 |
| WO | 9934256 A1 | 7/1999 |
| WO | 2011153016 A1 | 12/2011 |

* cited by examiner

FIG. 3B SHADOW MASK

FIG. 3A SUBSTRATE

007
SHADOW MASK ALIGNMENT USING CODED APERTURES

BACKGROUND OF THE INVENTION

1. Field of the Invention

The present invention relates to accurately aligning a shadow mask and a substrate in connection with the deposition of a material on the substrate in a vapor deposition system.

2. Description of Related Art

Accurate aligning of a shadow mask to a substrate in a vapor deposition system is critical to the accurate deposition of one or more materials on the substrate. Unfortunately, most vapor deposition systems include enclosed vacuum deposition vessels where one or more vapor deposition events occur and it is difficult to manually align a shadow mask to a substrate with a high degree of accuracy. Moreover, current automated and semi-automated systems for aligning a shadow mask to a substrate do not have the necessary alignment accuracy to provide a desired degree of accuracy when vapor depositing materials on the substrate, especially when the substrate is subject to multiple vapor deposition events using multiple different shadow masks.

It would, therefore, be desirable to provide a method and system of shadow mask to substrate alignment that enables one or more materials to be vapor deposited on the substrate via one or more shadow masks in a highly accurate and repeatable manner.

SUMMARY OF THE INVENTION

The invention is a shadow mask-substrate alignment method comprising: (a) providing a substrate including a grate having a plurality of spaced bars; (b) providing a shadow mask including a grate having a plurality of spaced bars; (c) providing a light source-light receiver pair, with the light receiver of said pair positioned in a path of light output by the light source of said pair; (d) causing the grate of the substrate and the grate of the shadow mask to be positioned in the path of the light; and (e) following step (d), causing the orientation of the substrate, the shadow mask or both to be adjusted to position the grate of the substrate, the grate of the shadow mask, or both until a predetermined amount of collimated light on the path passes through the grates and is received by the light receiver.

The bars of each grate can be in spaced (desirably parallel) relation. A gap can separate each pair of spaced bars. Each gap can have the same width. Each bar can have the same width. Each bar and each gap can have the same width.

Each grate can include a gap separating each pair of spaced bars. Step (e) can include causing the orientation of the substrate, the shadow mask or both to be adjusted to position elongated axes of the bars of the substrate parallel to elongated axes of the bars of the shadow mask, and to position the bars of the substrate and the shadow mask to partially overlap the gaps of the shadow mask and the substrate, respectively. Desirably, the bars of the substrate and the shadow mask can partially overlap the gaps of the shadow mask and the substrate, respectively, by 50%.

The collimated light source can include an LED and a collimating lens operative for collimating light output by the LED. The light receiver can include a PIN diode and a focusing lens operative for focusing light received thereby onto the PIN diode.

The substrate and the shadow mask can each include a plurality of grates. Step (c) can include providing a plurality of collimated light source-light receiver pairs, wherein the light receiver of each said pair is positioned in a path of collimated light output by the collimated light source of said pair. Step (d) can include positioning in each path of collimated light one grate of the substrate and one grate of the shadow mask. Step (e) can include causing the orientation of the substrate, the shadow mask or both to be adjusted to position the grates of the substrate, the grates of the shadow mask, or both until a predetermined amount of collimated light on each path passes through the grates in the path and is received by the light receiver in said path.

Each light receiver can output a signal having a level related to amount of light received by said light receiver. Step (e) can include adjusting the orientation of the substrate, the shadow mask or both until a combination of the levels of the signals output by the light receivers equals a predetermined value or falls within a predetermined range of values. The predetermined value can be zero.

The substrate and the shadow mask can each have a rectangular or square shape with one grate adjacent each corner of the rectangle or square. A longitudinal axis of each bar can extend radially ±15 degrees from a central axis of the corresponding substrate or shadow mask.

The invention is also a shadow mask-substrate alignment method comprising: (a) providing a substrate having a plurality of grates in a pattern; (b) providing a shadow mask having a plurality of grates in the same pattern as the plurality of grates of the substrate, wherein each grate of the substrate and each grate of the shadow mask includes a plurality of spaced bars; (c) defining a plurality of light paths, wherein each light path includes a light source-light receiver pair; (d) coarse positioning the substrate and the shadow mask such that the pattern of grates of the substrate are in coarse alignment with the pattern of grates of the shadow mask; (e) positioning in each light path one grate of the substrate in coarse alignment with one grate of the shadow mask; and (f) fine positioning the substrate, the shadow mask, or both until a predetermined amount of light on each path passing through the grates in the path is received by the light receiver of said path.

The bars of each grate can be in spaced parallel relation. A gap can separate each pair of spaced parallel bars. Each bar and each gap can have the same width.

Each grate can include a gap separating each pair of spaced bars. Step (f) can include fine positioning the substrate, the shadow mask, or both until the bars of the substrate and the shadow mask partially overlap the gaps of the shadow mask and the substrate, respectively. Desirably, the bars of the substrate and the shadow mask can partially overlap the gaps of the shadow mask and the substrate, respectively, by 50%.

The light source can include an LED and a collimating lens operative for collimating light output by the LED. The light receiver can include a PIN diode and a focusing lens operative for focusing light received thereby onto the PIN diode.

Each light receiver can output a signal having a level related to amount of light received by said light receiver. Step (f) can include fine positioning the substrate, the shadow mask or both until a combination of the levels of the signals output by the light receivers equals a predetermined value or falls within a predetermined range of values. The predetermined value can be zero.

The substrate and the shadow mask can each have a rectangular or square shape with one grate adjacent each corner of the rectangle or square. A longitudinal axis of each bar can extend radially ±15 degrees from a central axis of the corresponding substrate or shadow mask.

DETAILED DESCRIPTION OF THE INVENTION

Figures 1A, 1B:
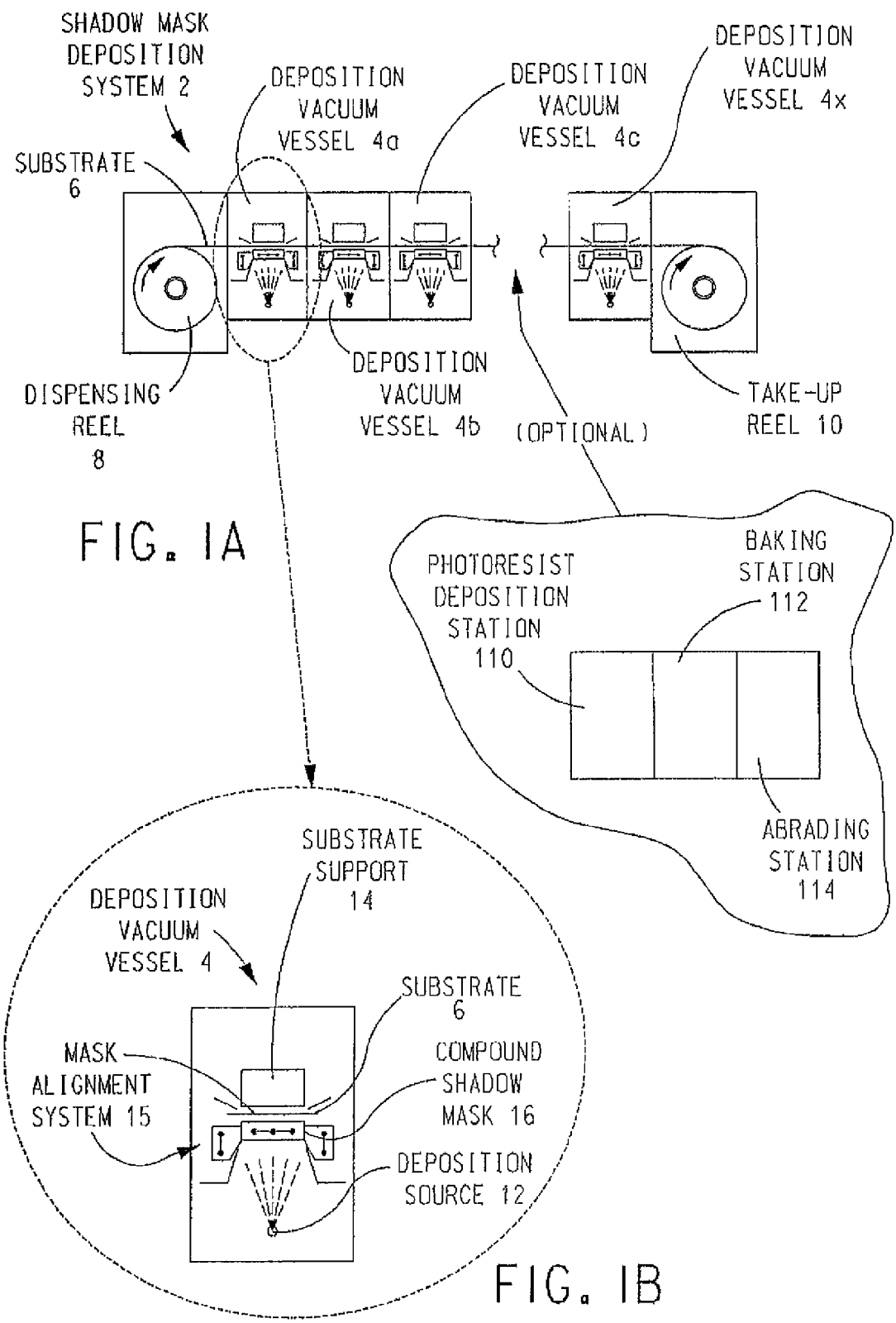
FIG. 1A is a diagrammatic illustration of a shadow mask deposition system for forming pixel structures of a high resolution OLED active matrix backplane.
FIG. 1B is an enlarged view of a single deposition vacuum vessel of the shadow mask deposition system of FIG. 1A.

With reference to FIGS. 1A and 1B, a shadow mask deposition system 2 for forming an electronic device, such as, without limitation, a high resolution active matrix organic light emitting diode (OLED) display, includes a plurality of serially arranged deposition vacuum vessels 4 (e.g., deposition vacuum vessels 4a-4x). The number and arrangement of deposition vacuum vessels 4 is dependent on the number of deposition events required for any given product to be formed therewith.

In one exemplary non-limiting use of shadow mask deposition system 2, a continuous flexible substrate 6 translates through the serially arranged deposition vacuum vessels 4 by means of a reel-to-reel mechanism that includes a dispensing reel 8 and a take-up reel 10. Alternatively, substrate 6 can be a standalone (versus continuous) substrate that is translated through serially arranged deposition vacuum vessels 4 by any suitable means known in the art. Hereinafter, for the purpose of describing the present invention, it will be assumed that substrate 6 is a standalone substrate.

Each deposition vacuum vessel includes a deposition source 12, a substrate support 14, a mask alignment system 15, and a shadow mask 16. For example, deposition vacuum vessel 4a includes deposition source 12a, substrate support 14a, mask alignment system 15a, and shadow mask 16a; deposition vacuum vessel 4b includes deposition source 12b, substrate support 14b, mask alignment system 15b, and shadow mask 16b; and so forth for any number of deposition vacuum vessels 4.

Each deposition source 12 is charged with a desired material to be deposited onto substrate 6 through one or more openings in the corresponding shadow mask 16 which is held in intimate contact with the portion of substrate 6 in the corresponding deposition vacuum vessel 4 during a deposition event. Shadow mask 16 can be a conventional single layer shadow mask or a compound (multi-layer) shadow mask of the type disclosed in U.S. Pat. No. No. 7,638,417 to Brody, which is incorporated herein by reference.

Each shadow mask 16 of shadow mask deposition system 2 includes one or more openings. The opening(s) in each shadow mask 16 correspond(s) to a desired pattern of material to be deposited on substrate 6 from a corresponding deposition source 12 in a corresponding deposition vacuum vessel 4 as substrate 6 is translated through shadow mask deposition system 2.

Each shadow mask 16 can be formed of, for example, nickel, chromium, steel, copper, Kovar® or Invar®, and has a thickness desirably between 20 and 200 microns, and more desirably between 20 and 50 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that shadow mask deposition system 2 may include additional stages (not shown), such as an anneal stage, a test stage, one or more cleaning stages, a cut and mount stage, and the like, as are well-known. In addition, the number, purpose, and arrangement of deposition vacuum vessels 4 can be modified by one of ordinary skill in the art as needed for depositing one or more materials in a desired order required for a particular application. An exemplary shadow mask deposition system and method of use thereof is disclosed in U.S. Pat. No. 6,943,066 to Brody et al., which is incorporated herein by reference.

Deposition vacuum vessels 4 can be utilized for depositing materials on substrate 6 to form one or more electronic elements of an electronic device on substrate 6. Each electronic element may be, for example, a thin film transistor (TFT), a memory element, a capacitor, etc. A combination of one or more electronic elements can be deposited to form a higher level electronic element, such as, without limitation, a sub-pixel or a pixel of the electronic device. As disclosed in U.S. Pat. No. 6,943,066 incorporated herein by reference, a multi-layer circuit can be formed solely by successive depositions of materials on substrate 6 via successive deposition events in deposition vacuum vessels 4.

Each deposition vacuum vessel 4 is connected to a source of vacuum (not shown) which is operative for establishing a suitable vacuum therein in order to enable a charge of the material disposed in the corresponding deposition source 12 to be deposited on substrate 6 in a manner known in the art, e.g., sputtering or vapor phase deposition, through the one or more openings in the corresponding shadow mask 16.

Regardless of the form of substrate 6, e.g., a continuous sheet or a standalone substrate, each deposition vacuum vessel 4 can include supports or guides that avoid the sagging of substrate 6 as it translates therethrough.

In operation of shadow mask deposition system 2, the material disposed in each deposition source 12 is deposited on substrate 6 in the corresponding deposition vacuum vessel 4 through one or more openings in the corresponding shadow mask 16 in the presence of a suitable vacuum as said substrate 6 is advanced through the deposition vacuum vessel 4, whereupon plural, progressive patterns is fanned on substrate 6. More specifically, substrate 6 is positioned for a predetermined time interval in each deposition vacuum vessel 4. During this predetermined time interval, material is deposited from the corresponding deposition source 12 onto substrate 6. After this predetermined time interval, substrate 6 is advanced to the next vacuum vessel in series for additional processing, as applicable. This advancement continues until substrate 6 has passed through all deposition vacuum vessels 4 whereupon substrate 6 exits the final deposition vacuum vessel 4 in the series.

Figure 2:
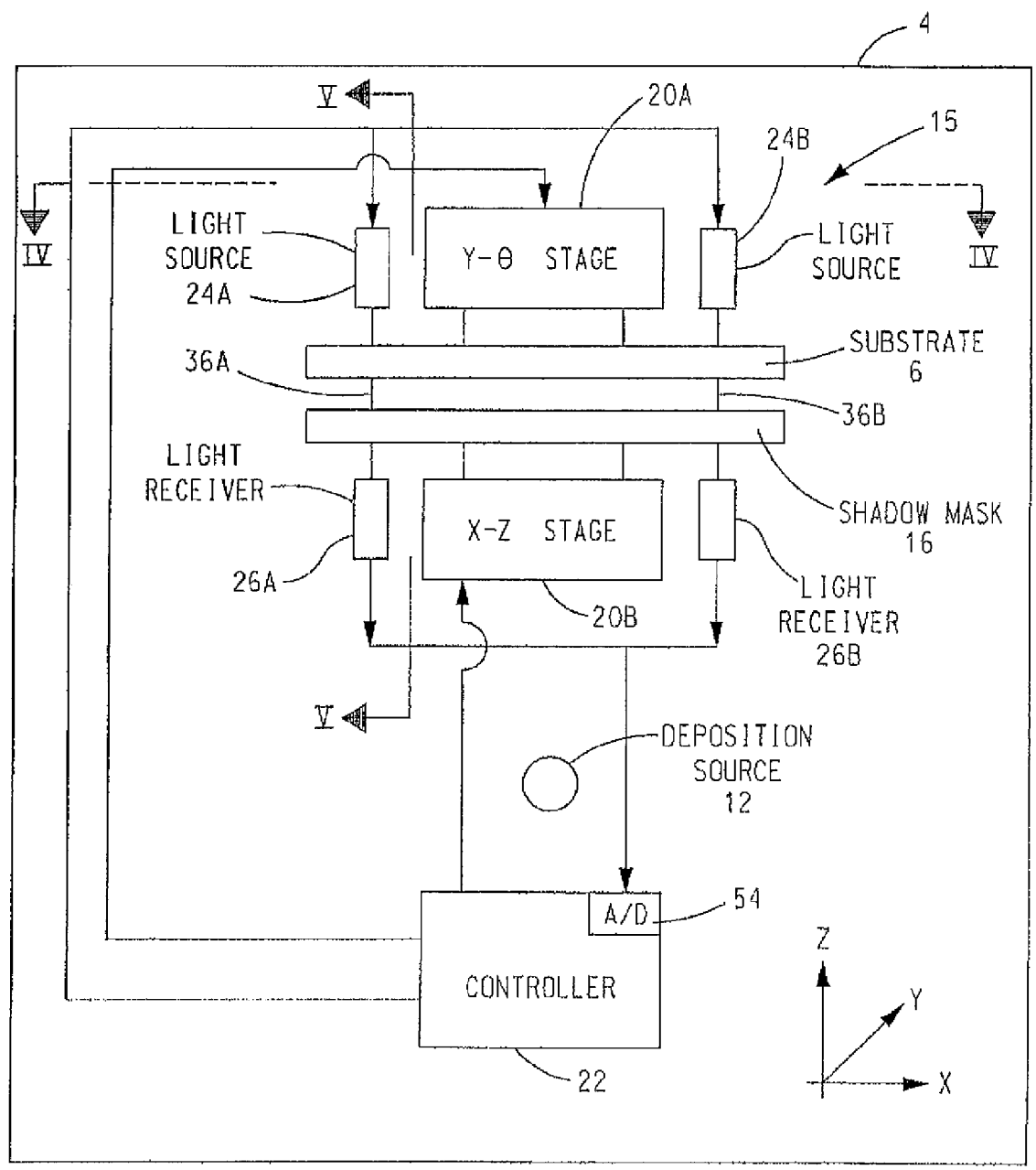
FIG. 2 is a diagrammatic view of a shadow mask alignment system in accordance with the present invention.

With reference to FIG. 2 and with continuing reference to FIGS. 1A and 1B, mask alignment system 15 includes one or more motion stages 20 for controlling the orientation and position of substrate 6, shadow mask 16, or both, to align substrate 6 and shadow mask 16 in a manner described hereinafter. One desirable, non-limiting, embodiment of mask alignment system 15 includes substrate 6 coupled to a Y-θ stage 20A and shadow mask 16 coupled to an X-Z stage 20B. The use of one or more stages 20 to effect translation, orientation, and positioning of substrate 6, shadow mask 16, or both in the X direction, the Y direction, the Z direction, and/or the θ direction (in the present example the θ direction is rotational translation of substrate 6 in the X-Y plane) is well known in the art and will not be described further herein for the purpose of simplicity.

Y-θ stage 20A and X-Z stage 20B are operated under the control of a controller 22 which can be implemented by any suitable and/or desirable combination of hardware and/or software to effect control of motion stages 20A and 20B in the manner described hereinafter.

Mask alignment system 15 further includes one or more light sources 24 and one or more light receivers 26. Each light source 24 is positioned in alignment with one light receiver 26 to define a light source 24-light receiver 26 pair. Each light source 24-light receiver 26 pair defines a light path 36 therebetween.

In use of mask alignment system, substrate 6 and shadow mask 16 are positioned in the light path 36 of each light source 24-light receiver 26 pair. In one desirable embodiment, mask alignment system 15 includes four light sources 24 and four light receivers 26, for a total of four light source 24-light receiver 26 pairs that define four light paths 36. However, this is not to be construed as limiting the invention.

Figure 3:
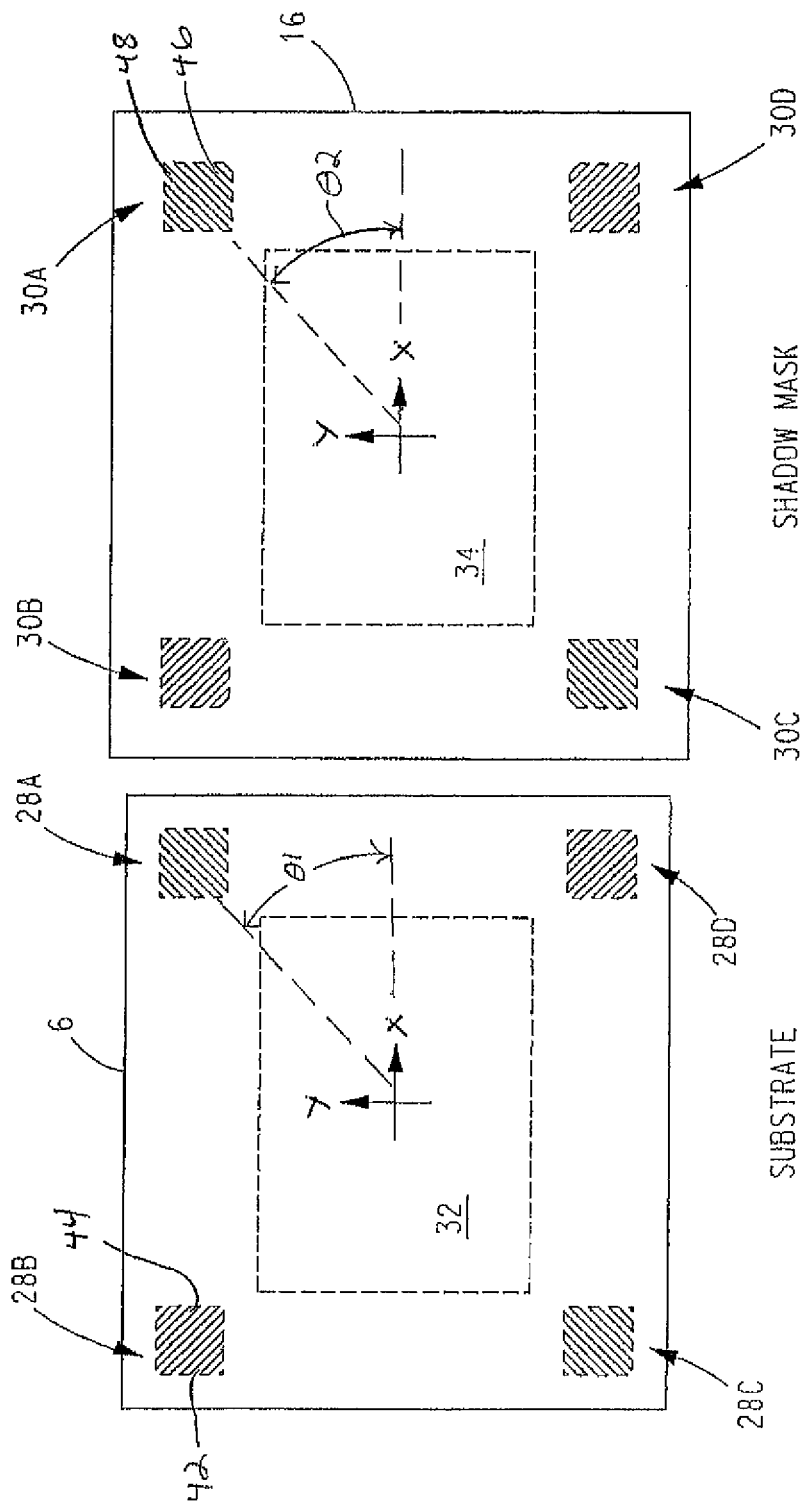
FIG. 3A and FIG. 3B are plan views of an exemplary substrate and shadow mask, respectively, each of which includes a number of alignment grates to facilitate orientation and positioning of the shadow mask to the substrate, or vice versa.

With reference to FIGS. 3A-3B and with continuing reference to FIGS. 1A-1B and 2, substrate 6 includes one or more grates 28 and shadow mask 16 includes one or more grates 30. In one non-limiting embodiment, substrate 6 includes four grates 28A-28D and shadow mask 16 includes four grates 30A-30D. In the embodiment shown in FIG. 3A, substrate 6 has a rectangular or square shape and each grate 28A-28D is positioned adjacent one of the four corners of substrate 6. Similarly, shadow mask 16 has a rectangular or square shape and each grate 30A-30D is positioned adjacent one of the four corners of shadow mask 16. The central portion of substrate 6 denoted by reference number 32 is where deposition events are to occur on substrate 6. The central portion of shadow mask 16 denoted by the reference number 34 is where shadow mask 16 includes a pattern of one or more openings where material from a deposition source 12 passes for deposit on area 32 in the same pattern as the one or more openings of area 34 of shadow mask 16.

In the embodiment of substrate 6 shown in FIG. 3A, grate 28B is a mirror image of grate 28A about the Y-axis shown in FIG. 3A; and grates 28C and 28D are mirror images of grates 28B and 28A, respectively, about the X-axis shown in FIG. 3A. However, this is not to be construed as limiting the invention.

Similarly, in the embodiment of shadow mask 16 shown in FIG. 3B, grate 30B is a mirror image of grate 30A about the Y-axis shown in FIG. 3B; and grates 30C and 30D are mirror images of grates 30B and 30A, respectively, about the X-axis shown in FIG. 3B. However, this is not to be construed as limiting the invention.

The use of mask alignment system 15 to align substrate 6 having one or more grates 28 and shadow mask 16 having one or more grates 30 will now be described.

Initially, substrate 6 is moved into spaced, coarse (or general) alignment with shadow mask 16 in the light paths 36 between light source(s) 24 and light receiver(s) 26 as shown in FIG. 2. When substrate 6 and shadow mask 16 are in coarse alignment in light paths 36 as shown in FIG. 2, each grate 28 of substrate 6 and each grate 30 of shadow mask 16 are positioned in one light path 36 of one light source 24-light receiver 26 pair. For example, where mask alignment system 15 includes four light source-light receiver pairs 24A-26A, 24B-26B, 24C-26C, and 24D-26D defining four light paths 36A-36D, respectively, and substrate 6 includes grates 28A-28D, and shadow mask 16 includes grates 30A-30D: grates 20A and 30A are positioned in light path 36A that runs from light source 24A to light receiver 26A; grates 26B and 30B are positioned in light path 36B that runs from light source 24B to light receiver 26B; grates 28C and 30C are positioned in light path 36C that runs from light source 24C to light receiver 26C; and grates 28D and 30D are positioned in light path 36D which runs from light source 24D to light receiver 26D.

Figure 4:
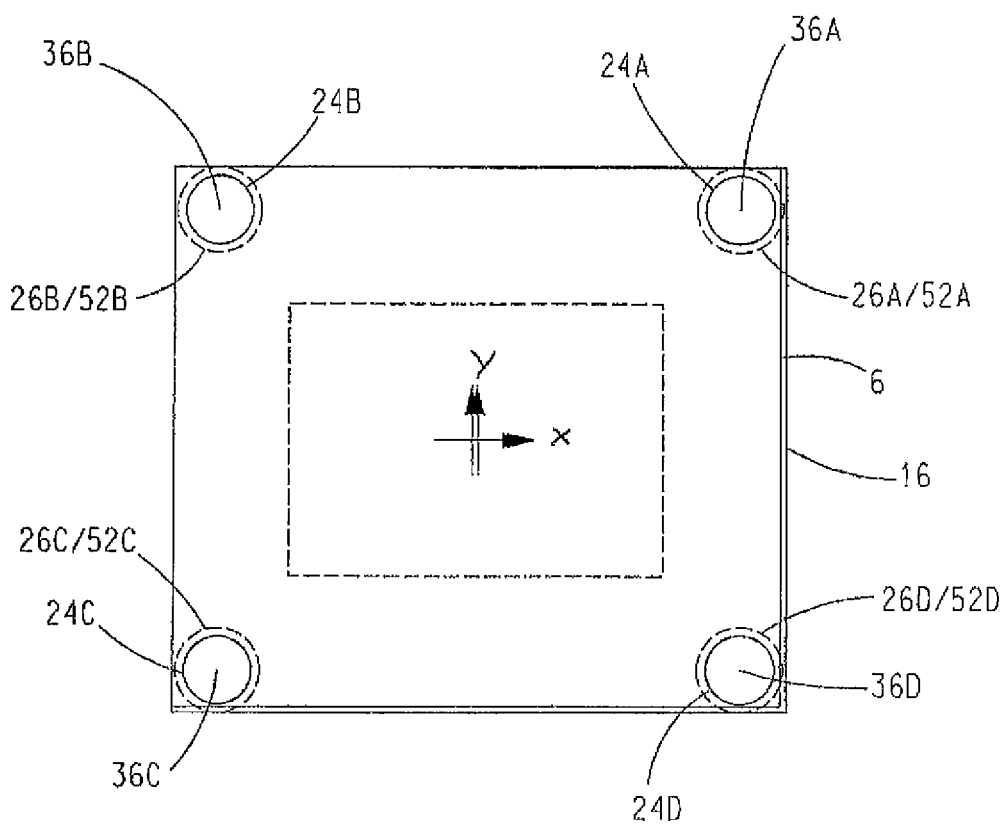
FIG. 4 is a view taken along lines IV-IV in FIG. 2.

FIG. 4 is a top down view of substrate 6 in coarse alignment with shadow mask 16 between light sources 24A-24D and light receivers 26A-26D (shown in phantom) and the position of light paths 36A-36D for each light source-light receiver pair, respectively. In FIG. 4 it is to be understood that grates 26A and 30A are positioned in light path 36A; grates 28B and 30B are positioned in light path 36B; grates 28C and 30C are positioned in light path 36C; and grates 28D and 30D are positioned in light path 36D.

Figure 5:
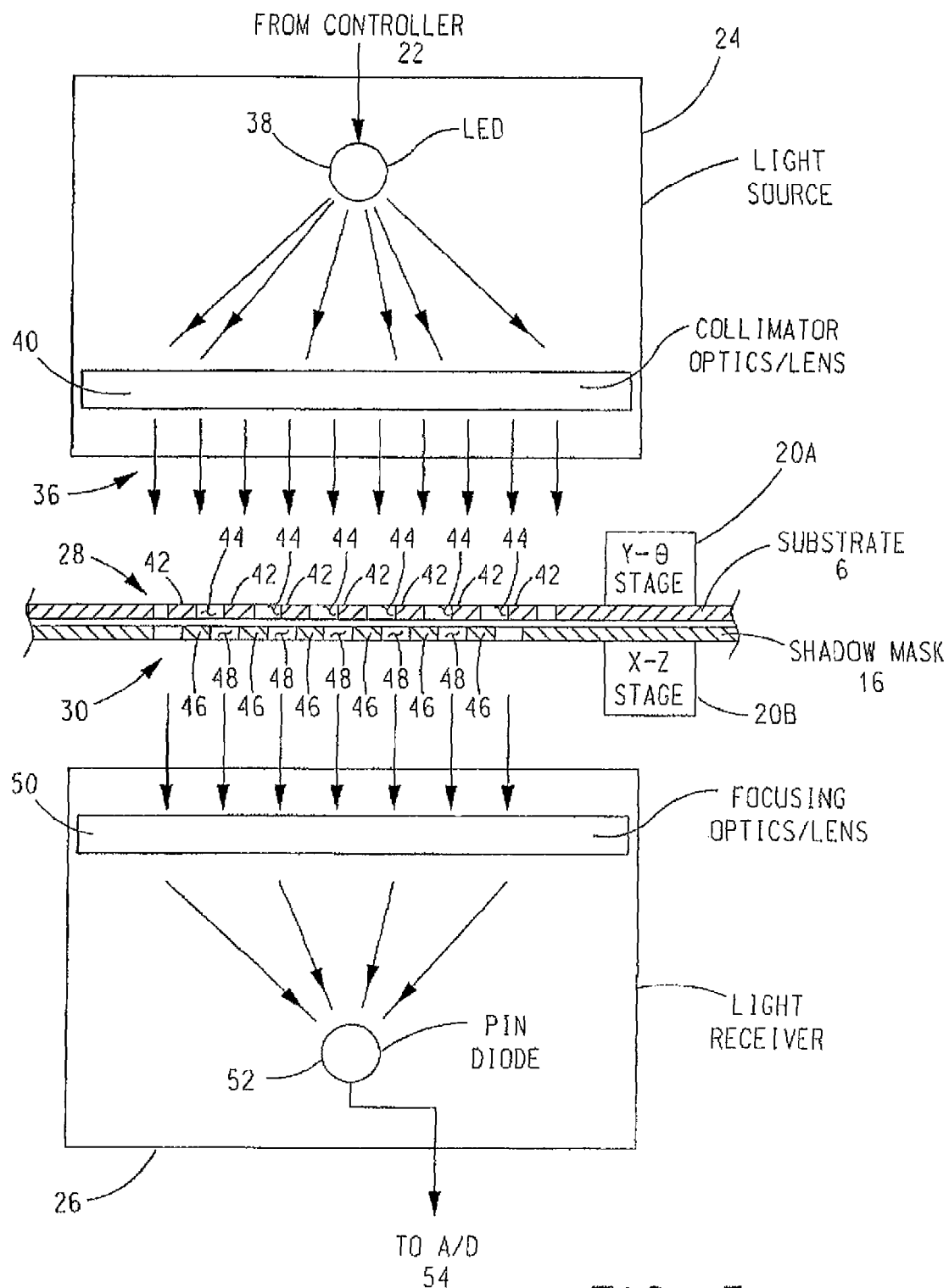
FIG. 5 is a view taken along lines V-V in FIG. 2.

With reference to FIG. 5, the fine alignment of one grate 28 of substrate 6 and one grate 30 of shadow mask 16 (i.e., one grate pair 28-30) lying along one light path 36 will now be described. It is to be understood, however, that the fine alignment of the grate pair 28-30 lying along the light path 36 shown in FIG. 5 is also applicable to the alignment of each grate pair 28-30 positioned in each light path 36.

At a suitable time, each light source 24 is activated to output light along its light path 36. In one, non-limiting, embodiment each light source includes an LED 38 which outputs light to a collimator optic/lens 40 which collimates the light output by LED 38 and outputs said collimated light along light path 36.

Each grate 28 of substrate 6 includes a plurality of spaced bars 42, desirably spaced parallel bars. Each pair of spaced bars 42 is separated by a gap 44. Desirably, the width of each gap 44 is the same. Similarly, each grate 30 includes a plurality of spaced bars 46, desirably spaced parallel bars. Each pair of spaced bars 46 is separated by a gap 48. Desirably, the width of each gap 48 is the same. Desirably, the width of each gap 44 and each gap 48 are also the same. However, the widths of the gaps being the same in grate 28, grate 30, or both grates 28 and 30 is not to be construed as limiting the invention.

With continuing reference to FIG. 5 and with reference back to FIGS. 3A and 3B, it is not necessary that each bar or each gap of substrate 6 and shadow mask 16 be oriented or positioned at the same angle relative to its respective X axis. For example, a longitudinal axis of each bar 42 and each gap 44 of substrate 6 is desirably, nominally oriented or positioned at an angle θ1 of 45 degrees with respect to the X axis shown in FIG. 3A. However, the orientation angle θ1 of the longitudinal axis of each bar 42 and each gap 44 can vary ±15 degrees with respect to the nominal orientation angle θ1 of 45 degrees with respect to the X axis. Moreover, each bar 42 and each gap 44 can be oriented or positioned at a different angle θ1. Desirably, however, the bars 42 and gaps 44 of each grate of substrate 6 are parallel.

Similarly, a longitudinal axis of each bar 46 and each gap 48 of shadow mask 16 is desirably, nominally oriented or positioned at an angle θ2 of 45 degrees with respect to the X axis shown in FIG. 3B. However, the orientation angle θ2 of the longitudinal axis of each bar 46 and each gap 48 can vary ±15 degrees with respect to the nominal orientation angle θ2 of 45 degrees with respect to the X axis. Moreover, each bar 46 and each gap 48 can be oriented or positioned at a different angle θ2. Desirably, however, the bars 46 and gaps 48 of each grate of shadow mask 16 are parallel.

More generally, the longitudinal axis of each bar 42, 46, and the longitudinal axis of each gap 44 and 48 desirably extends radially ±15 degrees from a center of substrate 6 and shadow mask 16, respectively. Desirably, for each grate, the bars and gaps of said grate are parallel. However, it is also envisioned that the bars and gaps of said grate can extend radially in a spoke-like pattern from the center of substrate 6 or shadow mask 16, as may be the case. Thus, where angles θ1-θ2 are, for example, without limitation, oriented or positioned at an angle of 30 degrees with respect to the corresponding X axis, the longitudinal axis of each bar 42, 46, and the longitudinal axis of each gap 44 and 48 can vary from 30 degrees by ±15 degrees.

It should be appreciated that it is possible for the angular displacement between bars 42 and 46 and gaps 48 and 44 of any grate pair 28-30 can vary by as much as 30 degrees, e.g., when a bar 42 is positioned at an angle of 60 degrees with respect to the X axis of its substrate 6, a gap 48 is positioned at an angle of 30 degrees with respect to the X axis of its shadow mask 16, and the X axes of the substrate 6 and the shadow mask 16 are parallel; the difference between 60 degrees and 30 degrees being 30 degrees.

Collimated light output by light source 24 passes through the gaps 44 and 48 of coarsely aligned grates 28 and 30, respectively, and is received by light receiver 26. Light receiver 26 includes a focusing optics/lens 50 which focuses the collimated light after passage through the coarsely aligned gaps 44 and 48 of grates 28 and 30 for receipt by a light detection means in the form of a PIN diode 52. The output of each PIN diode 52 of each light receiver 26 of mask alignment system 15 is provided to an analog-to-digital (A/D) convertor 54 of controller 22 which converts the analog output of each PIN diode 52 into a corresponding digital signal for processing by a processing means of controller 22. The output of each PIN diode 52 corresponds to the amount of light received by the PIN diode 52—the greater the amount of light received by the PIN diode 52 the greater its output voltage, the lesser the amount of light received by the PIN diode 52 the lesser its output voltage.

At a suitable time, controller 22 commences fine positioning of substrate 6, shadow mask 16, or both via Y-θ stage 20A and/or X-Z stage 20B to align substrate 6 and shadow mask 16 relative to each other such that, for each grate pair 28-30 positioned in a light path 36, at least some of the bars 42 of grate 28 overlap (in a direction transverse, desirably perpendicular to light path 36) some of the gaps 48 of grate 30 to a desired extent, and at least some of the bars 46 of grate 30 overlap (in a direction transverse, desirably perpendicular to light path 36) some of the gaps 44 of grate 28 to a desired extent. Desirably, each gap 48 of shadow mask 16 is partially overlapped by a bar 42 of substrate 6 and each gap 44 of substrate 6 is partially overlapped by a bar 46 of shadow mask 16 as shown in FIG. 5. More desirably, bars 42 and 46 partially overlap the width of gaps 48 and 44, respectively, by 50%. In other words, 50% of the width of gaps 48 and 44 is overlapped by bars 42 and 46.

For each grate pair 28-30 positioned in one of the light paths 36, controller 22 detects when bars 42 and 46 overlap gaps 48 and 44, respectively, to a desired extent, by comparing the digitized output of the PIN diode 52 on said light path 36 (which digitized output is obtained via A/D 54 and which digitized output corresponds to the collimated light passing through gaps 48 and 44) to a predetermined value or a predetermined range of values. Upon detecting that the digitized output of the PIN diode 52 is not at the predetermined value or within the predetermined range of values, controller 22 causes one or more motion stages 20A and 20B to adjust the X, Y, and/or θ position of substrate 6, shadow mask 16, or both, as necessary until a desired amount of overlap between the bars 42 and 46 overlap gaps 48 and 44, respectively, of the grate pair 28-30 is detected by controller 22 via the digitized output of PIN diode 52. Since the amount of overlap between bars 42 and 46 and gaps 48 and 44, respectively, of the grate pair 28-30 affects the amount of collimated light that reaches PIN diode 52, by comparing the digitized output of PIN diode 52 to the predetermined value or the predetermined range of values, controller 22 can determine when an appropriate amount of overlap of the bars and gaps of the grate pair 28-30 in light path 36 has been achieved. In a similar manner, controller 22 can determine when an appropriate amount of overlap of the bars and gaps of each other grate pair 28-30 in each other light path 36 has been achieved.

In one non-limiting embodiment, controller 22 desirably combines the output of all of the PIN diodes 52 of light receivers 26A-26D to determine when proper X, Y, and θ alignment between substrate 6 and shadow mask 16 has been achieved. More specifically, suppose controller 22 adjusts the orientation/position of substrate 6, shadow mask 16, or both. After some period of time, controller 22 stops adjusting the orientation/position of substrate 6, shadow mask 16, or both, and causes A/D 54 to sample and digitize the outputs of PIN diodes 52A-52D (shown in FIG. 4) of light receivers 26A-26D. Controller 22 associates in a memory of controller 22 the digitized outputs of PIN diodes 52A-52D with variables f1-f4 and combines these variables for the X, Y, and rotational or angular (θ) displacements of substrate 6, shadow mask 16, or both as follows:

$$X\text{ displacement} = f1 - f2 - f3 + f4 \quad \text{(Equation 1)}$$

$$Y\text{ displacement} = f1 + f2 - f3 - f4; \text{ and} \quad \text{(Equation 2)}$$

$$\theta\text{ displacement} = f1 - f2 + f3 - f4. \quad \text{(Equation 3)}$$

Upon controller 22 determining that the X, Y, and θ displacements determined by Equations 1-3 above each equals 0, controller 22 recognizes this condition as corresponding to substrate 6 and shadow mask 16 having a desired alignment, On the other hand, if any one of the X displacement, Y displacement, or θ displacement is not equal to 0, controller 22 recognizes this condition as corresponding to substrate 6 and shadow mask 16 NOT having a desired alignment, whereupon controller 22 causes the one or more motion stages 20A-20B to adjust the X, Y, and/or θ position(s) of substrate 6, shadow mask 16, or both, as necessary to cause the X displacement, Y displacement, or θ displacement determined by Equations 1-3 above to each equal 0.

Desirably, controller 22 repeats the foregoing steps of adjusting the orientation/position of substrate 6, shadow mask 16, or both; stopping the adjusting of the orientation/position of substrate 6, shadow mask 16, or both; sampling and digitizing the outputs of PIN diodes 52A-52D; and determining whether the X, Y, and θ displacements determined by Equations 1-3 above each equals θ until the X, Y, and θ displacements determined by Equations 1-3 above in fact each equals θ, a predetermined number of repetitions of said steps has occurred, or a predetermined amount of time has elapsed. Upon determining that the X, Y, and θ displacements each equals θ, controller 22 causes the motion stage 20 that moves in the Z direction to move substrate 6 and shadow mask 16 into intimate contact from the position in spaced relationship shown in FIG. 5, which spaced relation is used for the purpose of aligning substrate 6 and shadow mask 16.

The determination of the X, Y, and θ displacements using Equations 1-3 in the above-described manner to each equal θ, however, is not to be construed as limiting the invention since it is envisioned that each displacement can be within a range of suitable values unique to said displacement or common to all of said displacements. For example, without limitation, controller 22 can be programmed such that an X displacement that falls within a range of ±1 is acceptable, that a range ±1.5 for the Y displacement value is acceptable, and that a range of ±0.5 for the θ displacement is acceptable. Alternatively, controller 22 can be programmed to use the same range of values for each displacement. For example, controller 22 may be programmed such that it is acceptable to have each of the X, Y, and θ displacements fall within a range of ±1.

As can be seen, by utilizing the output of the PIN diodes 52A-52D of light receivers 26A-26D, controller 22 can position substrate 6 and shadow mask 16 in a desired state of alignment with a high degree of accuracy. To this end, controller 22 can incrementally orient/position substrate 6, shadow mask 16, or both, until the grates 28 of substrate 6 and the grates 30 of shadow mask 16 are aligned to a desired extent. In the event controller 22 determines that further alignment of substrate 6 and shadow mask 16 is needed, controller 22 can make an informed decision from the values of the X, Y, and θ displacements determined using Equations 1-3 above which way to move or rotate substrate 6, shadow mask 16, or both, in the X, Y, and θ directions as necessary to improve the alignment of substrate 6 and shadow mask 16. Thus, controller 22 can orient/position substrate 6, shadow mask 16, or both, in a first position and then acquire the output of the PIN diodes 52A-52D of light receivers 26A-26D to determine if substrate 6 and shadow mask 16 are properly aligned. If so, controller 22 causes substrate 6 and shadow mask 16 to move in the Z direction into intimate contact in preparation for a deposition event occurring in deposition vacuum vessel 4. However, if substrate 6 and shadow mask 16 are determined to not be in proper alignment, controller 22 can incrementally orient/position substrate 6, shadow mask 16, or both, to another position, where controller 22 samples the outputs of the PIN diodes 52A-52D of light receivers 26A-26D. The process of sampling the outputs of PIN diodes 52A-52D of light receivers 26A-26D and incrementally orienting/positioning substrate 6, shadow mask 16, or both, continues until controller 22 determines that substrate 6 and shadow mask 16 are aligned to a desired extent determined by the programming of controller 22.

As can be seen, controller 22 causes the orientation of the substrate 6, the shadow mask 16, or both, to be adjusted to position the grates 28 of substrate 6 and the grates 30 of shadow mask 16, or both, until a predetermined amount of collimated light on each light path 36 passes through the grates that lie on said light path 36 for receipt by the corresponding light receiver 26. Stated differently, controller 22 fine positions substrate 6, shadow mask 16, or both, until a predetermined amount of light on each light path 36 passes through the grates in said path and is received by the light receiver on said light path.

The invention has been described with reference to exemplary embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask-substrate alignment method comprising:
   (a) providing a substrate including a grate having a plurality of bars in spaced relation, wherein each pair of spaced bars of the grate of the substrate is separated by a gap;
   (b) providing a shadow mask including a grate having a plurality of bars in spaced relation, wherein each pair of spaced bars of the grate of the shadow mask is separated by a gap through the shadow mask;
   (c) providing a collimated light source - light receiver pair, with the light receiver of said pair positioned in a path of collimated light output by the collimated light source of said pair;
   (d) causing the grate of the substrate and the grate of the shadow mask to be positioned in the path of the collimated light; and
   (e) following step (d), causing the orientation of the substrate, the shadow mask or both to be adjusted to position the grate of the substrate, the grate of the shadow mask, or both until a predetermined amount of collimated light on the path passes through the gaps in the grate of the substrate and the gaps with the grate of the shadow mask and is received by the light receiver.

2. The method of claim 1, wherein each bar and each gap has the same width.

3. The method of claim 1, wherein:
   step (e) includes causing the orientation of the substrate, the shadow mask or both to be adjusted to position elongated axes of the bars of the grate of the substrate parallel to elongated axes of the bars of the grate of the shadow mask, and to position the bars of the grates of the substrate and the shadow mask to partially overlap the gaps of the grates of the shadow mask and the substrate, respectively.

4. The method of claim 3, wherein the bars of the grates of the substrate and the shadow mask partially overlap the gaps of the grates of the shadow mask and the substrate, respectively, by 50%.

5. The method of claim 1, wherein the collimated light source comprises:
   an LED; and
   a collimating lens operative for collimating light output by the LED.

6. The method of claim 1, wherein the light receiver comprises:
   a PIN diode; and
   a focusing lens operative for focusing light received thereby onto the PIN diode.

7. The method of claim 1, wherein:
   the substrate and the shadow mask each include a plurality of grates;
   step (c) includes providing a plurality of collimated light source-light receiver pairs, wherein the light receiver of each said pair is positioned in a path of collimated light output by the collimated light source of said pair;
   step (d) includes positioning in each path of collimated light one grate of the substrate and one grate of the shadow mask; and
   step (e) includes causing the orientation of the substrate, the shadow mask or both to be adjusted to position the grates of the substrate, the grates of the shadow mask, or both until a predetermined amount of collimated light on each path passes through the grates in the path and is received by the light receiver in said path.

8. The method of claim 7, wherein:
   each light receiver outputs a signal having a level related to amount of light received by said light receiver; and step (e) includes adjusting the orientation of the substrate, the shadow mask or both until a combination of the levels of the signals output by the light receivers equals a predetermined value or falls within a predetermined range of values.

9. The method of claim 8, wherein the predetermined value is zero.

10. The method of claim 7, wherein the substrate and the shadow mask each have a rectangular or square shape with one grate adjacent each corner of the rectangle or square.

11. The method of claim 1, wherein a longitudinal axis of each bar extends radially ±15 degrees from a central axis of the corresponding substrate or shadow mask.

12. The method of claim 1, wherein each pair of spaced bars of the grate of the substrate is separated by a gap through the substrate.

13. A shadow mask-substrate alignment method comprising:
   (a) providing a substrate having a plurality of grates in a pattern;
   (b) providing a shadow mask having a plurality of grates in the same pattern as the plurality of grates of the substrate, wherein each grate of the substrate includes a plurality of bars in spaced relation, wherein each pair of spaced bars of the grate of the substrate is separated by a gap, wherein each grate of the shadow mask includes a plurality of bars in spaced relation, and wherein each pair of spaced bars of the grate of the shadow mask is separated by a gap through the shadow mask;
   (c) defining a plurality of light paths, wherein each light path includes a light source-light receiver pair;
   (d) coarse positioning the substrate and the shadow mask such that the pattern of the grates of the substrate are in coarse alignment with the pattern of the grates of the shadow mask;
   (e) positioning in each light path one grate of the substrate in coarse alignment with one grate of the shadow mask; and
   (f) fine positioning the substrate, the shadow mask, or both until a predetermined amount of light on each path passing through the gaps in the grates of the substrate and the gaps in the grates of the shadow mask in said path is received by the light receiver on said path.

14. The method of claim 13, wherein each bar and each gap has the same width.

15. The method of claim 13, wherein:
   step (f) includes fine positioning the substrate, the shadow mask, or both until the bars of the substrate and the shadow mask partially overlap the gaps of the shadow mask and the substrate, respectively.

16. The method of claim 15, wherein the bars of the substrate and the shadow mask partially overlap the gaps of the shadow mask and the substrate, respectively, by 50%.

17. The method of claim 13, wherein the light source comprises:
   an LED; and
   a collimating lens operative for collimating light output by the LED.

18. The method of claim 13, wherein the light receiver comprises:
   a PIN diode; and
   a focusing lens operative for focusing light received thereby onto the PIN diode.

19. The method of claim 13, wherein:
   each light receiver outputs a signal having a level related to amount of light received by said light receiver; and
   step (f) includes fine positioning the substrate, the shadow mask, or both until a combination of the levels of the signals output by the light receivers equals a predetermined value or falls within a predetermined range of values.

20. The method of claim 19, wherein the predetermined value is zero.

21. The method of claim 13, wherein:
   the substrate and the shadow mask each have a rectangular or square shape with one grate adjacent each corner of the rectangle or square; and
   a longitudinal axis of each bar extends radially ±15 degrees from a central axis of the corresponding substrate or shadow mask.

22. The method of claim 13, wherein each pair of spaced bars of the grate of the substrate is separated by a gap through the substrate.

* * * * *